United States Patent [19]

Butler et al.

[11] Patent Number: 4,975,659

[45] Date of Patent: Dec. 4, 1990

[54] AMPLIFIER PACKAGE USING VERTICAL POWER TRANSISTORS WITH UNGROUNDED COMMON TERMINALS

[75] Inventors: Scott J. Butler, Rochdale; Robert J. Regan, Needham, both of Mass.

[73] Assignee: GTE Laboratories Incorporated, Waltham, Mass.

[21] Appl. No.: 369,989

[22] Filed: Jun. 22, 1989

[51] Int. Cl.⁵ .............................................. H03F 3/04
[52] U.S. Cl. .................................... 330/307; 330/277; 330/286; 330/301
[58] Field of Search ................. 330/87, 156, 165, 168, 330/277, 289, 301, 307

[56] References Cited

U.S. PATENT DOCUMENTS

| | | | |
|---|---|---|---|
| 2,924,778 | 2/1960 | Barton | 330/156 X |
| 3,178,648 | 4/1965 | Tanner | 330/156 UX |
| 3,381,238 | 4/1968 | Barton et al. | 330/165 |

FOREIGN PATENT DOCUMENTS 231345  4/1959  Australia .............................. 330/289

*Primary Examiner*—James B. Mullins
*Attorney, Agent, or Firm*—James J. Cannon, Jr.; Victor F. Lohmann, III

[57] ABSTRACT

A power amplifier circuit utilizes vertical power transistors, such as static induction transistors, field effect transistors, or bipolar junction transistors, in a configuration where an ungrounded terminal serves as a common node while a separate reference terminal is connected directly to ground. A transformer of appropriate bandwidth couples an rf input signal to the input terminals of the transistor such that the input terminals are floating relative to ground. The novel amplifier circuit establishes separate electrical paths between the common terminal and the input circuit and between the common terminal and the output circuit. Thus, negative feedback is not present in the common lead, thereby improving gain, power output, and efficiency. Moreover, the circuit, in either a BJT, FET, or SIT configuration, can be fabricated on thinned semiconductor chips to form a transistor package in which the chips are bonded directly to the package heatsink.

8 Claims, 5 Drawing Sheets

AMPLIFIER PACKAGE USING VERTICAL POWER TRANSISTORS WITH UNGROUNDED COMMON TERMINALS

FIELD OF THE INVENTION

This invention concerns amplifier circuits and, more particularly, a novel power amplifier circuit employing vertical power transistors, such as static induction transistors, field effect transistors or bipolar junction transistors, which minimizes thermal interfaces and reduces common lead parasitic immitances, thereby improving gain, output power and frequency response.

BACKGROUND OF THE INVENTION

High frequency power amplifiers have typically employed vertical power transistors mounted on a high thermal conductivity ceramic substrate such as BeO to electrically isolate the transistor from the mounting flange/heatsink, while providing a low thermal resistance path. There is an inherent trade-off associated with this technique, however, since lower thermal resistance is achieved with a thinner substrate while lower parasitic capacitance dictates the use of thicker substrates.

Transistor amplifiers have been fabricated with vertical transistors mounted directly on the heatsink/ground by using a common drain configuration wherein the drain is coupled to ground. A transistor operated in the common drain configuration, however, exhibits lower gain and $f_t$ than other configurations and results in limited power output and efficiency. In addition, the input voltage swing is limited, compared to other amplifier configurations, due to the nonsymmetrical nature of the device, that is, the gate-source and gate-drain characteristics are generally not the same. Typical prior art configurations having common electrodes (gate and source, respectively) coupled to ground are illustrated in FIGS. 1 and 2. These configurations, however, are not amenable to high efficiency, high power applications at high frequencies.

Furthermore, conventional transistor amplifier circuits having a common grounded electrode introduce negative feedback due to the input and output current pathways having a common segment through which both of these currents flow. For example, input ac current 15 and output ac current 16 in FIG. 1 both flow through a common lead 17 connecting the gate electrode G to ground. As will be shown in the following discussion of the present invention, the novel amplifier disclosed herein establishes separate paths for the input and output currents, thereby preventing negative feedback.

The above discussion regarding the disadvantages of conventional FET amplifiers is also applicable to conventional BJT devices, where the common drain, common gate, and common source configurations are analogous to common collector, common base, and common emmiter configurations, respectively.

OBJECTS OF THE INVENTION

A principal object of the present invention is to provide a novel power amplifier circuit utilizing vertical power transistors which eliminates the need to use a thermally conductive substrate to electrically isolate the transistor from the heatsink.

It is another object of the invention to provide a mounting package for a vertical power transistor which minimizes thermal interfaces and reduces common lead parasitic immitances.

It is yet another object of the invention to provide a power amplifier with improved gain, output power and frequency response.

SUMMARY OF THE INVENTION

These and other objects of the invention are realized by providing an amplifier circuit which allows field effect transistor (FET) and static induction transistor (SIT) operation in a common gate or common source configuration while having the drain terminal grounded, and also allows bipolar junction transistor (BJT) operation in a common emitter or common base configuration while having the collector terminal grounded.

In these configurations, a transformer accepts an RF input signal at its primary winding and provides an input signal to the transistor from its secondary winding such that the input terminals of the transistor are floating relative to ground. The transformer coupling permits a common-electrode configuration where one of the electrodes other than the common one is connected directly to ground. Consequently, separate electrical paths are established for the input and output signals of the transistor, thereby preventing negative feedback in the amplifier. The novel circuit configurations are fabricated using thinned semiconductor chips to form a transistor package in which the chips are bonded directly to the package heatsink.

This invention provides lower thermal resistance, reduced package parasitic immitances, and the elimination of common lead inductance in the package, thereby resulting in improved gain and frequency response over that which can be achieved with conventional amplifier circuits.

BRIEF DESCRIPTION OF THE DRAWINGS

FIG. 3A is a simplified schematic circuit diagram of a high frequency, high power amplifier to illustrate the ac operation of the common-gate, grounded-drain configuration in accordance with one embodiment of the present invention;

FIG. 4A is a simplified schematic circuit diagram of a high frequency, high power amplifier to illustrate the ac operation of the common-source, grounded-drain configuration in accordance with another embodiment of the present invention;

DESCRIPTION OF THE PREFERRED EMBODIMENT

Figure 1:
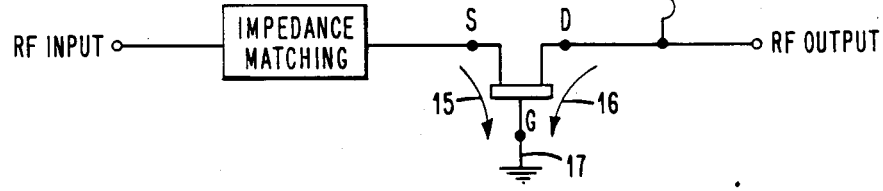
FIGS. 1 and 2 are schematic circuit diagrams of prior art circuits showing a common-gate, grounded-gate and a common-source, grounded-source configuration, respectively.
Figure 2:
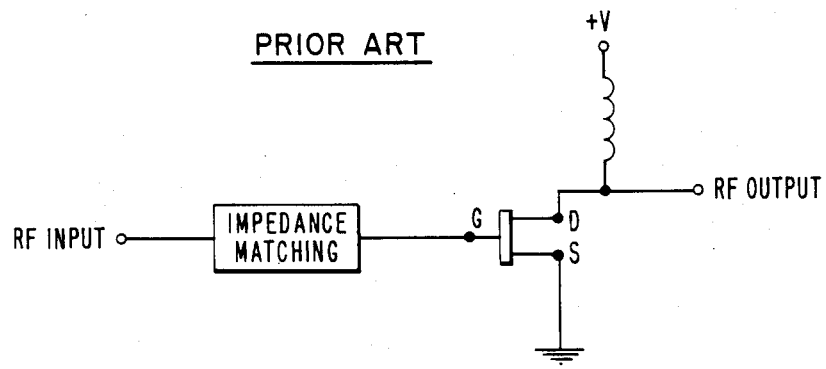

FIG. 3A is a simplified schematic circuit diagram illustrating the ac operation of a high frequency, high power amplifier circuit using a novel transistor configuration in accordance with the present invention. The specific embodiment of FIG. 3A utilizes static induction transistors (SITs) in a common gate configuration with the drain terminal connected directly to ground. This configuration eliminates the need for electrically isolating the transistor from a heatsink by directly connecting the drain terminal to ground and establishing a common node other than ground via transformer coupling. The specific embodiment of FIG. 3A is just one example of a transistor configuration which avoids using an isolating substrate between the transistor and heatsink. Accordingly, other configurations using BJT and FET transistors are possible and will be apparent to those skilled in the art after a reading of the specification.

As shown in FIG. 3A, an input terminal 10 receives an rf signal which is amplified by an SIT vertical power transistor Q1 before being delivered to a load at an output circuit 12. The amplifier is operated from a dc supply voltage (not shown). The rf input signal is coupled via transformer T1 to the input terminals of transistor Q1, which are the gate G (node 14) and source S, in a manner whereby the gate and source terminals are floating relative to ground. The node 14 also serves as one terminal of the output circuit 12, with the other terminal being connected to ground through the drain electrode D. Since the input signal is applied between the source and gate electrodes of SIT Q1 while the output signal is derived between the gate and the drain (ground), the amplifier is able to establish separate electrical paths for the input and output currents of the amplifier. As indicated, input current 18 flows between the source and gate (common node 14), while output current 19 flows between the drain, which is connected by a lead to ground, and common node 14. Thus, each current path is separate from the other even though they share a common connection point. Although a novel amplifier configuration employing a transistor Q1 is disclosed in FIG. 3A transistor Q1 exhibits the same characteristics as it would in a conventional common gate groundedgate configuration.

Figure 3B:
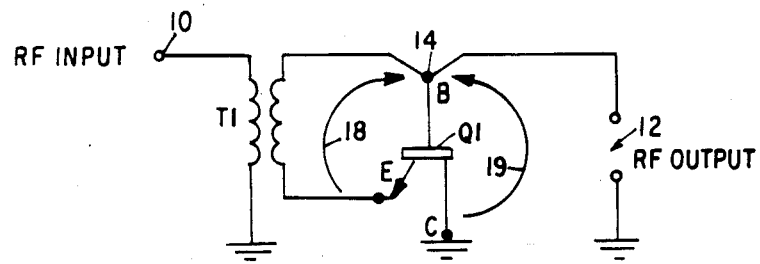
FIG. 3B is a simplified schematic circuit diagram of a high frequency, high power amplifier to illustrate the AC operation of a common-base, grounded-collector BJT configuration in accordance with another embodiment of the present invention.

FIG. 3B shows an alternate embodiment of the configuration in FIG. 3A where transistor Q1 is a common-base, grounded-collector bipolar junction transistor. The above discussion regarding operation of the amplifier with a FET is equally applicable to the configuration of FIG. 3B.

FIG. 4A is also a simplified schematic diagram showing an arrangement similar to that of FIG. 3, but for a commonsource, grounded-drain configuration Here, the source electrode S serves as the common connection point 14 and is coupled to both the input circuit (represented by rf input terminal 10 and transformer T1) and the output terminal 12, with the drain electrode being similarly grounded.

Figure 4B:
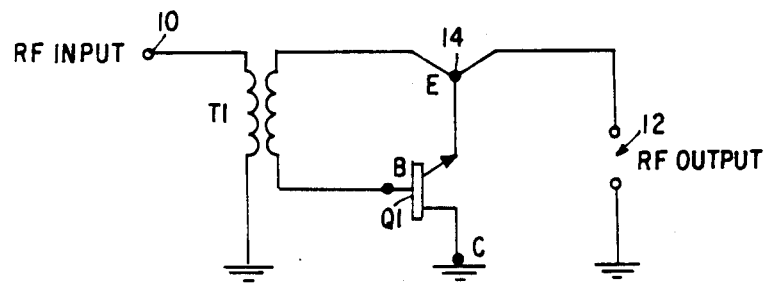
FIG. 4B is a simplified schematic circuit diagram of a high frequency, high powered amplifier to illustrate the AC operation of a common-emitter, grounded-collector BJT configuration in accordance with another embodiment of the present invention.

FIG. 4B similarly shows an alternate embodiment of the circuit schematic diagram of FIG. 3B where the transistor Q1 is a common-emitter, grounded-collector BJT. The emitter electrode E serves as the common connection point 14 and is coupled to both the input circuit and output terminal 12. In the amplifier circuits of FIGS. 3A, 3B, 4A, and 4B the potential bandwidth over which such operation can be obtained is limited by how well the transformer is able to decouple the input terminals of the transistor from ground. Since transmission line transformers and baluns can be fabricated for multi-octave bandwidths, this technique of transformer coupling is suitable for both wideband and narrowband applications.

Figure 5:
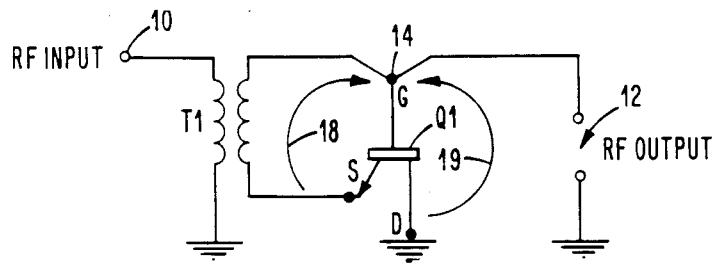
FIG. 5 is a plot of the small-signal gain versus frequency for the embodiment of FIG. 3.
Figure 5:
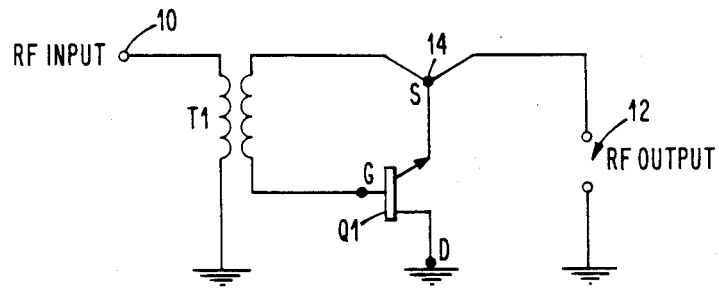
Figure 5:
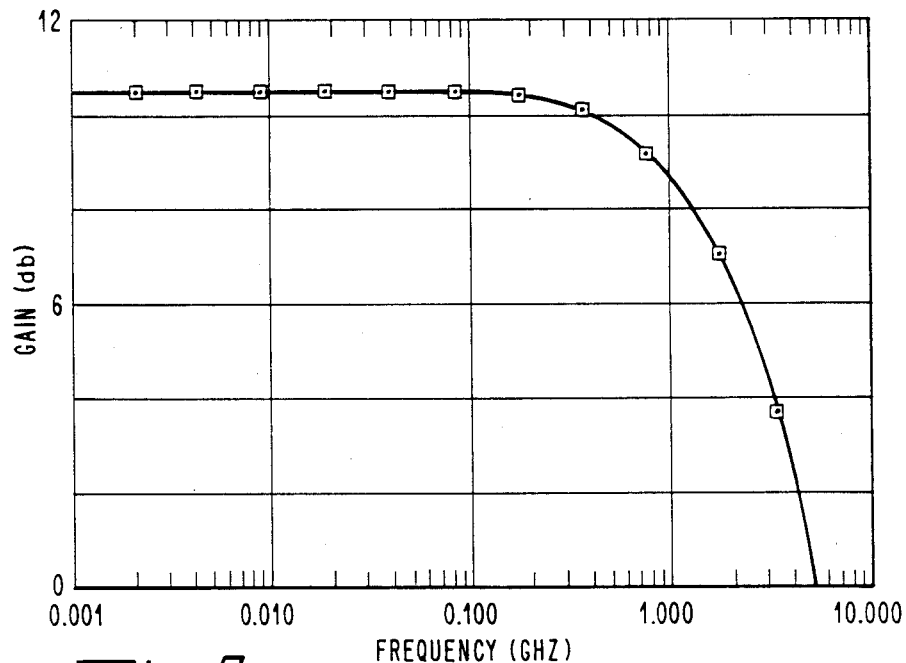
Figure 6:
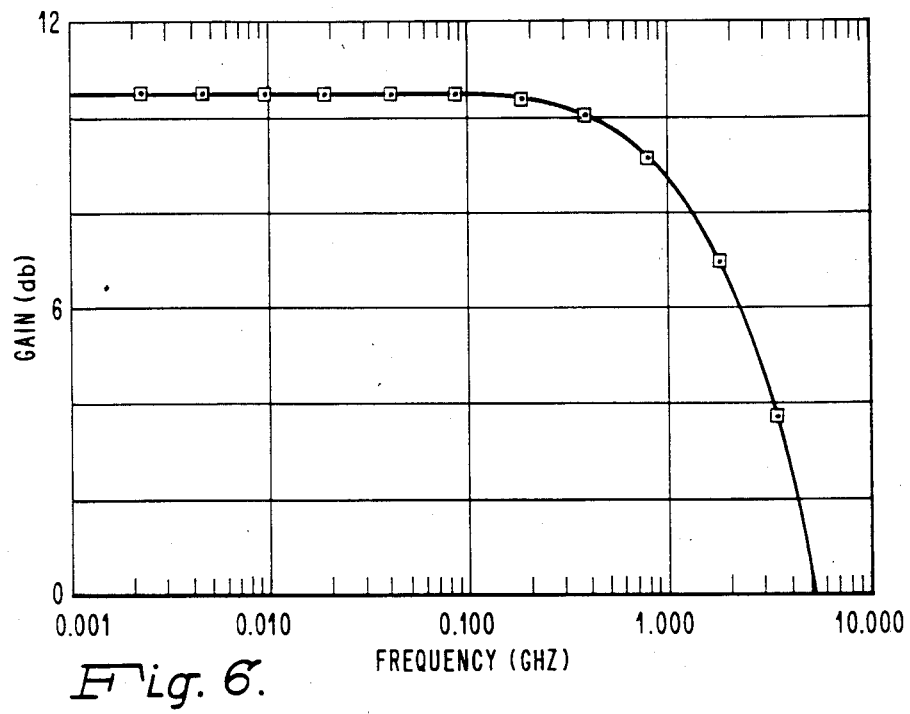
FIG. 6 is a plot of the small-signal gain versus frequency for the prior art common-gate, grounded-gate embodiment of FIG. 1.

An analysis of the small-signal gain characteristics of the common-gate, grounded drain transistor configuration in FIG. 3A was performed assuming an ideal input transformer, and the results are plotted in FIG. 5. For comparison, the results of a similar analysis regarding a conventional common-gate, grounded-gate configuration, such as that in FIG. 1, are shown in FIG. 6. Significantly, the FIGS. show that the common-gate amplifier according to the present invention performs equally as well as the corresponding prior art circuit in terms of gain and frequency response.

Figure 7:
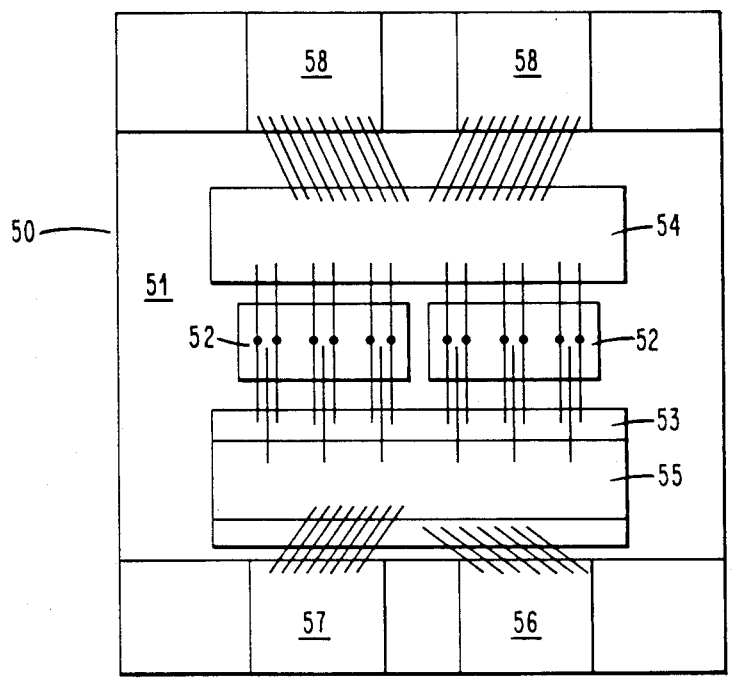
FIG. 7 is a top planar view of a transistor package using the common-gate, grounded-drain transistor of FIG. 3.

One of the most significant performance advantages of this invention is the reduction of thermal resistance which can be realized in a transistor package by bonding the thinned transistor chip or chips directly to the metal package flange instead of to an insulating substrate that is then mounted on the flange. In FIG. 7, an SIT package 50 comprises a copper flange 51 to which two grounded-drain, common-gate SIT chips 52 are bonded. Each chip 52 has its gate connected to both input gate pad 53 and output gate pad 54. The source leads of each chip 52 are connected to the input source pad 55. The input gate pad 53 and the input source pad 55 are connected to the input gate lead 56 and source gate lead 57, respectively, to provide connecting points to the rest of the circuit. The output gate pad 54 is connected to the output gate leads 58, which also provide connecting points to the rest of the circuit. In addition to the elimination of a high thermal conductivity insulating ceramic substrate, such as BeO, the number of thermal interfaces is minimized and common lead parasitic immitances are reduced. Conventional transistor amplifier configurations require that the common lead be electrically connected to ground via bond wires or ribbons, thereby resulting in appreciable common lead inductance. The circuit disclosed herein eliminates common lead inductance by providing separate electrical paths from the common node to both the input and output circuit. This also eliminates negative feedback in the common lead, thereby improving gain, power output and efficiency.

Figure 8:
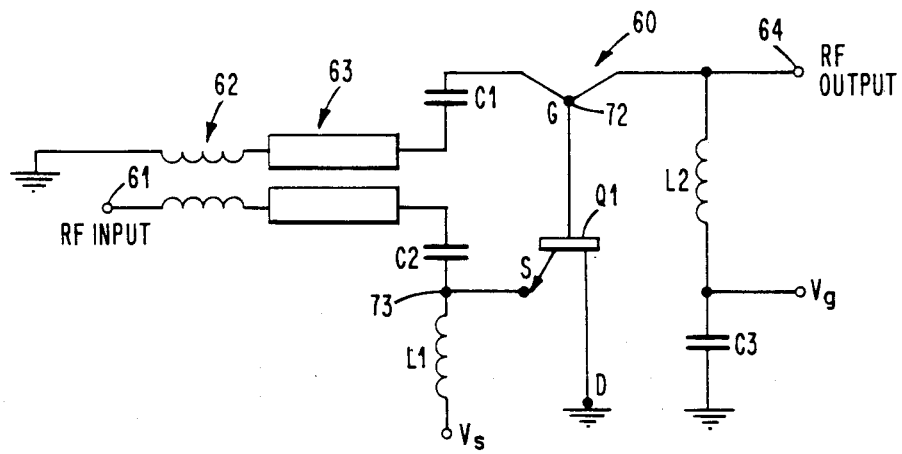
FIG. 8 is a schematic circuit diagram of a specific embodiment of a high frequency, high power amplifier according to the present invention.

FIG. 8 is a schematic circuit diagram of a specific embodiment of the present invention in which a 425 MHz grounded-drain, common-gate SIT power amplifier is designed using the novel transistor configuration of FIG. 3. High frequency power from an external source enters an input terminal 61 and is applied to a power amplifier 60 having a transistor Q1 before being delivered to a load at output terminal 62. The rf signal at input terminal 61 is coupled through a balun 62 and a quarter-wavelength transformer 63 before appearing across the input terminals 72 and 73 of Q1 formed by nodes 72 and 73. Nodes 72 and 73, as indicated, are connected to the gate electrode G and source electrode S, respectively, of transistor Q1. The transistor is in a common-gate configuration due to the node 72 being connected in common to both the transistor input terminals 72 and 73 and the output terminal 64.

The source electrode S and gate electrode G of transistor Q1 are biased by voltage sources Vs and Vg, respectively. Voltage source Vg is connected to ground through a bypass capacitor C3 and is connected to both the common node 72 and output terminal 64 through inductor L2. An inductor L1 between voltage source Vs and node 73 serves as an rf choke by acting as a high impedance ac blocking component at high frequencies, thereby preventing the voltage source Vs from being influenced by the ac operation of the amplifier. DC blocking capacitors C1 and C2 are connected between the output terminals of transformer 63 and transistor input terminals 72 and 73, respectively, to prevent a dc potential from appearing across the input terminals of transformer 63.

Figure 9:
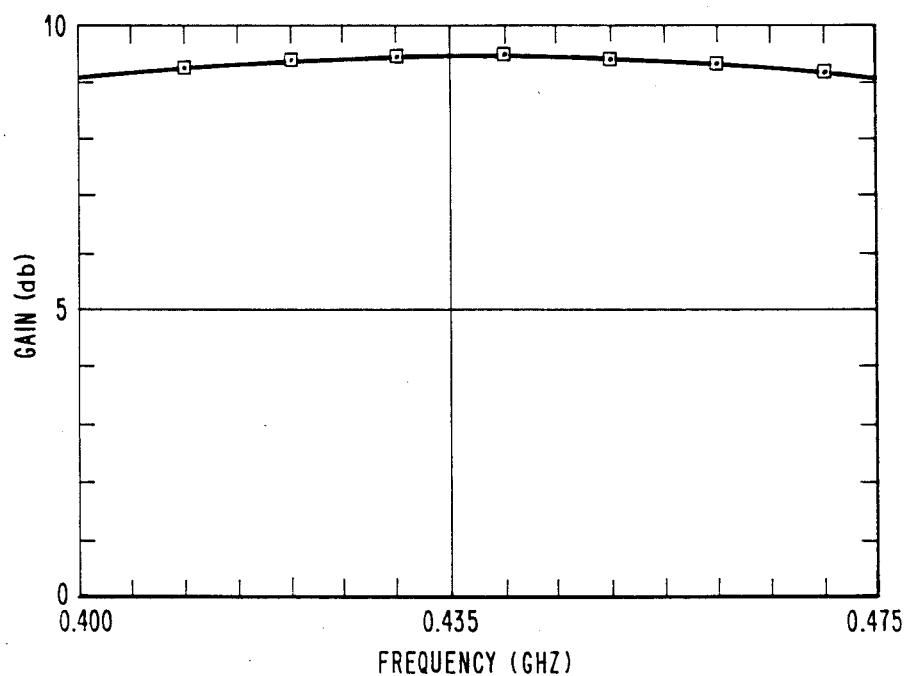
FIG. 9 is a plot of the gain versus frequency of the amplifier of FIG. 8.

The gain response of this amplifier design under small-signal conditions has been computed using Touchstone and is shown in FIG. 9.

What is claimed is:

1. A transistor package, comprising:
    a plurality of transistor chips each having a plurality of vertical power transistor cells;
    a first and second input lead providing electrical pathways to external circuits;
    a first input pad having electrical connections to said first input lead;
    a second input pad having electrical connections to said second input lead;
    a flange serving as a heatsink for said transistor chips wherein said chips are bonded directly to said flange;
    said first input pad being separated from said second input pad by an insulating pad to form a stacked arrangement which is mounted on said flange;
    each of said transistor cells having a first electrode connected to said first input pad, a second electrode connected to said flange, and a third electrode connected to said second input pad wherein said first and third electrodes are terminals of an input circuit and said first and second electrodes are terminals of an output circuit wherein said first electrode serves as a common node between said input circuit and said output circuit, thereby establishing separate electrical paths between said common node and said associated input circuit and between said common node and said associated output circuit;
    means for providing a floating input signal across the terminals of each respective input circuit such that their potential is floating relative to ground;
    an output pad having electrical connections to said output terminal of each transistor cell for receiving a transistor output signal from each of said transistor cells; and
    a plurality of output leads for providing connections to external circuits wherein each output lead has electrical connections to said output pad;
    whereby negative feedback is not present in each of said transistor cells due to the establishment of said separate electrical paths between said respective common node and said associated input and output circuits.

2. The transistor package as recited in claim 1 wherein
    said means for providing a floating input signal includes: a transformer having a primary winding receiving an RF input signal and a secondary winding coupled to the input circuit of said respective transistor cell.

3. The transistor package as recited in claim 1 wherein:
    each of said transistor cells is a common-gate field effect transistor wherein said first electrode is a gate electrode, said second electrode is a drain electrode, and said third electrode is a source electrode.

4. The transistor package as recited in claim 1 wherein:
    each of said transistor cells is a common-source field effect transistor wherein said first electrode is a source electrode, said second electrode is a drain electrode, and said third electrode is a gate electrode.

5. The transistor package as recited in claim 1 wherein:
    each of said transistor cells is a common-gate static induction transistor wherein said first electrode is a gate electrode, said second electrode is a drain electrode, and said third electrode is a source electrode.

6. The transistor package as recited in claim 1 wherein:
    each of said transistor cells is a common-source static induction transistor wherein said first electrode is a source electrode, said second electrode is a drain electrode, and said third electrode is a gate electrode.

7. The transistor package as recited in claim 1 wherein:
    each of said transistor cells is a common-base bipolar junction transistor wherein said first electrode is a base electrode, said second electrode is a collector electrode, and said third electrode is an emitter electrode.

8. The transistor package as recited in claim 1 wherein:
    each of said transistor cells is a common-emitter bipolar junction transistor wherein said first electrode is an emitter electrode, said second electrode is a collector electrode, and said third electrode is a base electrode.

* * * * *